United States Patent [19]
Okajima et al.

[11] Patent Number: 5,355,084
[45] Date of Patent: Oct. 11, 1994

[54] OPTICAL MAGNETIC-FIELD SENSOR HAVING SPHERICAL LENSES FOR LIGHT COLLIMATION

[75] Inventors: Hisakazu Okajima, Nishikasugai; Yuji Asai, Chita, both of Japan

[73] Assignee: NGK Insulators, Ltd., Japan

[21] Appl. No.: 745,191

[22] Filed: Aug. 15, 1991

[30] Foreign Application Priority Data

Aug. 30, 1990 [JP] Japan .................................. 2-226551

[51] Int. Cl.$^5$ .................. G01R 33/032; G01R 33/022; G01R 3/00; G02F 1/09
[52] U.S. Cl. .................. 324/244.1; 359/280; 29/595
[58] Field of Search ...................... 324/244.1, 260, 96; 359/280, 281, 282, 283; 385/6; 29/592.1, 595

[56] References Cited

U.S. PATENT DOCUMENTS 4,327,963 5/1982 Khoe et al. .
4,962,990 10/1990 Matsuzawa et al. ............. 324/244.1

FOREIGN PATENT DOCUMENTS 0345759 12/1989 European Pat. Off. .
63-217284 9/1988 Japan .

OTHER PUBLICATIONS

*Journal of Lightwave Technology*, "Fiber-Optic Current and Voltage Sensors Using a $Bi_{12}GeO_{20}$ Single Crystal", vol. LT-1, No. 1, Mar. 1983, pp. 93–97.

*Primary Examiner*—Walter E. Snow
*Attorney, Agent, or Firm*—Parkhurst, Wendel & Rossi

[57] ABSTRACT

An optical magnetic-field sensor includes a base fixed relative to distal ends of optical fibers inserted in the sensor, optical parts and an optical element for transmitting optical signals between the distal ends of the optical fibers. The optical signals are collimated between the optical parts and the distal ends of the optical fibers. The optical magnetic-field sensor further includes spherical lenses optically aligned with the distal ends of the optical fibers for collimating the optical signals, and synthetic resin members filled in clearances between the distal ends of the optical fibers and the spherical lenses, respectively. With the above arrangement, it is possible to effect the alignment of optical axes of the optical fibers and the spherical lenses easily with high accuracy in a short period of time.

3 Claims, 2 Drawing Sheets

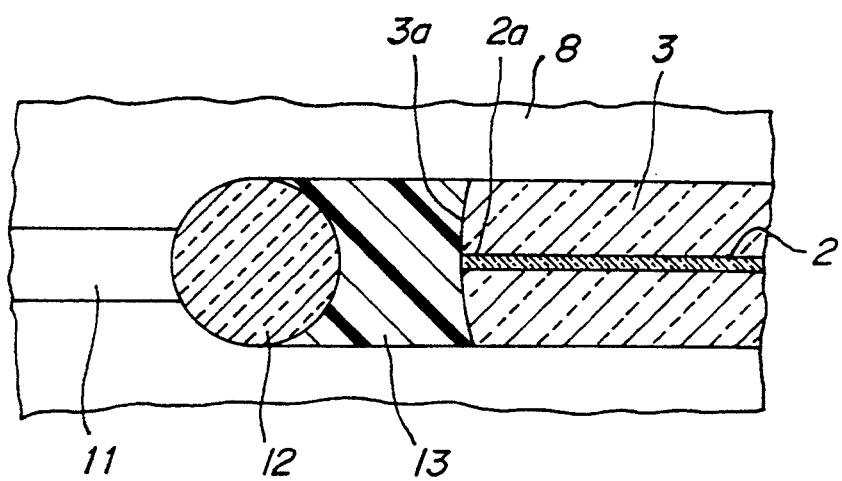
FIG_1
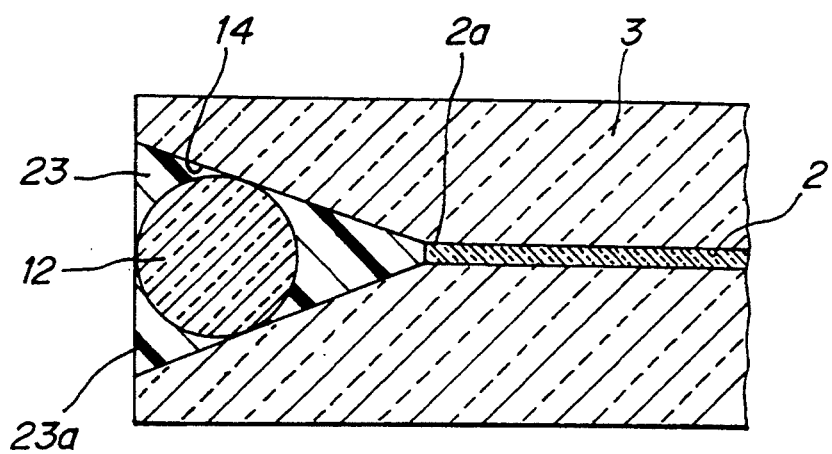
FIG_2

OPTICAL MAGNETIC-FIELD SENSOR HAVING SPHERICAL LENSES FOR LIGHT COLLIMATION

BACKGROUND OF THE INVENTION

This invention relates to an optical magnetic-field sensor which is mainly used in a detection system for finding fault points at electric power transmission line networks, electric power-distribution line networks, transformer substations and the like, and more particularly to a method of producing such an optical magnetic-field sensor.

In order to automatically find fault points in electric power systems, optical magnetic-field sensors using optical single crystals (for example, BSO or the like) have been recently used. In this device, the light emitted from a light transmitter is transmitted through a magnetooptical element and received into a light receiver where the light is detected. If electric current values are rapidly changed due to short-circuit or ground-fault, the magnitude of a magnetic field produced around the power-transmission line is changed so that the polarization plane of the light transmitted through the magnetooptical element is changed. The change in polarization plane is detected to determine the occurrence of a fault.

Such an optical magnetic-field sensor includes a magnetooptical element, a polarizer and an analyzer which are built in the sensor. Further, optical fibers which are inserted into the sensor and have distal ends fixed to the sensor by means of ferrules. The collimation (forming bundles of parallel beams, and light condensing) of the light from the distal ends of the optical fibers is effected by rod lenses. In practice, cylindrical rod lenses are joined with and fixed to the distal ends of the ferrules, respectively, and other surfaces of the cylindrical rod lenses are opposed to the polarizer and the analyzer, respectively. The light transmitted through one of the optical fibers is fed through one of the rod lenses to the polarizer, and the light emitted from the analyzer is transmitted through the other rod lens onto the distal end of the other optical fiber.

In the optical magnetic-field sensor described above, however, it is required to adjust the optical axes of the distal ends of the optical fibers and the rod lenses. A rod lens has a refractive index distribution in radial directions formed by adjusting radial distributions of metallic atoms. Therefore, if the center of the optical fiber is not coincident with the center of the refractive index distribution, the light is not collimated efficiently. Moreover, as the center of refractive index cannot be determined by inspecting the external form of the rod lens, the adjustment or alignment of the optical axes is a two dimensional operation, which is a time-consuming and troublesome operation.

Moreover, in the event that rod lenses are used, optical axes of the distal end of the optical fiber and the rod lens are frequently not coincident with each other owing to the above reason. Accordingly collimation of light is incomplete resulting in increase in losses of quantity of light. Consequently, it has been impossible to enlarge distances between the light transmitter and the light receiver respectively and the fault detecting point to an extent beyond certain distances.

SUMMARY OF THE INVENTION

It is an object of the invention to provide an optical magnetic-field sensor capable of easily carrying out the alignment of optical axes at a collimator portion with higher accuracy in a short time, and also to provide a method of producing such an improved optical magnetic-field sensor.

In order to accomplish this object, an optical magnetic-field sensor is provided including a base fixed relative to distal ends of optical fibers inserted in the sensor, optical parts for transmitting optical signals between the distal ends of the optical fibers and the optical parts, and between an optical element and the optical parts, the optical signals being collimated between the optical parts and the distal ends of the optical fibers, and spherical lenses optically aligned with the distal ends of the optical fibers for collimating the optical signals, and synthetic resin members filled in clearances between the distal ends of the optical fibers and the spherical lenses, respectively.

In a second aspect of the invention, in a method of producing an optical magnetic-field sensor including a base fixed relative to distal ends of optical fibers inserted in the sensor, and optical parts for transmitting optical signals between the distal ends of the optical fibers and the optical parts, and between an optical element and the optical parts, the optical signals being collimated between the optical parts and the distal ends of the optical fibers, comprises steps of filling a synthetic resin between the distal ends of the optical fibers and spherical lenses provided for collimating said optical signals, adjusting distances between the distal ends of the optical fibers and the spherical lenses before solidification of the synthetic resin to align the optical axes of the distal ends and the optical lenses with each other, and then solidifying the synthetic resin.

In a third aspect of the invention, in a method of producing an optical magnetic-field sensor including a base fixed relative to distal ends of optical fibers inserted in the sensor, and optical parts for transmitting optical signals between the distal ends of the optical fibers and the optical parts, and between an optical element and the optical parts, the optical signals being collimated between the optical parts and the distal ends of the optical fibers, comprises steps of filling a synthetic resin having an elasticity after solidification between the distal ends of the optical fibers and spherical lenses provided for collimating said optical signals, and adjusting distances between the distal ends of the optical fibers and the spherical lenses after solidification of the synthetic resin to align the optical axes of the distal ends and the optical lenses, respectively.

The "optical parts" used herein are intended to include a polarizer and an analyzer. The distal ends of the optical fibers may be fixed to the sensor by means of ferrules.

The invention will be more fully understood by referring to the following detailed specification and claims taken in connection with the appended drawings.

BRIEF DESCRIPTION OF THE DRAWINGS

FIG. 1 is an enlarged partial sectional view illustrating the proximity of the distal end of an optical fiber used in the optical magnetic-field sensor according to the invention;

FIG. 2 is an enlarged partial sectional view illustrating the proximity of the distal end of an optical fiber used in another embodiment of the invention.

Figure 3:
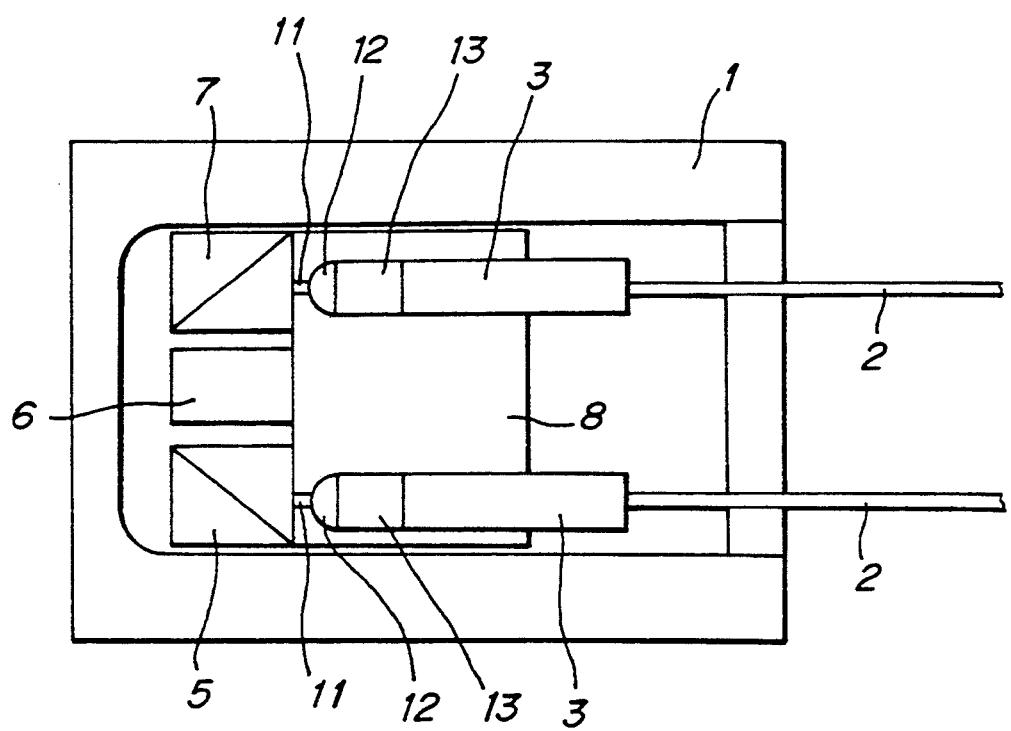
FIG. 3 is a schematic view illustrating one example of the optical magnetic-field sensor according to the invention.

Numbering in the drawings:
1 ... casing
2 ... optical fiber
2a ... end portion of optical fiber
3 ... ferrule
3a ... end portion of ferrule
5 ... polarizer
6 ... magnetooptical element
7 ... analyzer
8 ... base
11 ... V-shaped groove
12 ... spherical lens
13, 23 ... synthetic resin
14 ... recessed portion or notch

DESCRIPTION OF THE PREFERRED EMBODIMENTS

First, the whole construction of an optical magnetic-field sensor for automatically finding out fault points in electric power systems as one embodiment of the invention will be explained by referring to FIG. 3.

The optical magnetic-field sensor shown in FIG. 3 has a U-shaped layout in which components on the input side, a device portion and components on the output side are arranged. However, they may be arranged side by side on a straight line.

In more detail, a base 8 on which ferrules 3 are arranged on the input and output sides, respectively, is fixed into a casing 1. In the device portion, a polarizer 5, a magnetooptical element 6 and an analyzer 7 are arranged in this order. The positioning of the magnetooptical element 6 and the respective optical parts is effected by previously providing predetermined design patterns (for example, grooves or protrusions) on the base 8.

A collimator portion will then be explained in detail by referring to FIG. 1 illustrating a distal end of the ferrule 3 in section on an enlarged scale. The base 8 is formed with grooves 11 having a constant width and, for example, having a V-shaped cross-section, in which spherical lenses 12 are fixed and supported by means of jigs (not shown).

As the components on the input and output sides are substantially identical to each other, the components on the input side will be explained. An optical fiber 2 is fixed in the ferrule 3 arranged in the groove 11 formed in the base 8 by means of a jig (not shown). By positional adjustment of the ferrule 3, the optical axis of the distal end 2a of the optical fiber 2 is substantially brought into coincidence with that of the spherical lens 12. A synthetic resin 13, preferably epoxy resin is filled in the clearance between the end face 3a of the ferrule 3 and the spherical lens 12 as shown in FIG. 1.

Before solidification of the synthetic resin 13, the end face 3a of the ferrule 3 is finely adjusted onto the right and left sides viewed in FIG. 1 by means of a jig (not shown) during which light beams are transmitted through the optical fiber 2, so that the distance between the distal end 2a of the optical fiber 2 and the spherical lens 12 is finely adjusted to position the the distal end 2a of the optical fiber 2 in a most suitable position for collimating the light beams. After the positioning of the optical fiber 2, the synthetic resin 13 is permitted to solidify. As a result of the solidification of the synthetic resin 13, the spherical lens 12, the synthetic resin 13, the end face 3a of the ferrule 3 and the base 8 are maintained as a unitary body whose optical axes in the collimation portion have been adjusted in the optimum condition.

In another embodiment of the invention, after a ferrule 3 has been fixed, the spherical lens is finely adjusted onto the right and left to obtain the coincidence or alignment of the optical axes. As an alternative, after the spherical lens 12, the synthetic resin 13 and the end face 3a of the ferrule 3 have been joined as a unitary body but the synthetic resin 13 is not joined to the base 8, the positioning and fixation of the ferrule 3 to the base 8 may be effected mechanically or with an adhesive.

As a further alternative, a synthetic resin having an elasticity after solidification may be used as the synthetic resin 13. In this case, after solidification of the synthetic resin filled in the clearance between the spherical lens 12 and the end face 3a of the ferrule 3, the ferrule 3 and/or the spherical lens 12 is finely adjusted onto the right and left so as to adjust the distance therebetween to accomplish the alignment of the optical axes of the optical fiber 2 and the spherical lens 12. Thereafter, the ferrule 3 and the spherical lens 12 are fixed to the base 8.

With the optical magnetic-field sensor according to the invention, the light emitted from the end face 2a of the optical fiber 2 on the input side is collimated at the synthetic resin 13 and the spherical lens 12. The collimated light is then passed through the polarizer 5 to become linearly polarized light which is then transmitted through the magnetooptical element 6 during which the light is subjected to Farady rotation. Thereafter, the light is passed through the analyzer 7 wherein its intensity is changed dependent upon the Farady rotation. This quantity of light corresponds to the magnetic field applied to the magnetooptical element 6. The light emitted from the analyzer 7 is then condensed at the spherical lens 12 and the synthetic resin 13 on the output side and is incident onto the distal end 2a of the optical fiber on the output side.

In the optical magnetic-field sensor of the embodiment shown, the collimation is performed by the use of the spherical lens 12. The spherical lens utilizes the curvature of a spherical surface to form the refractive index gradient, which is different from the rod lens of prior art devices which control chemical composition thereof for refractive index manipulation. Therefore, the optical center of the spherical lens 12 is coincident with its geometrical center. Consequently, so long as the height of the geometrical center of the spherical lens 12 is previously made coincident with the height of the optical fiber 2 in design by adjusting the depth of the groove 11, their optical axes can be ultimately coincident or aligned with each other with ease, by simply sliding the ferrule 3 on the base in the axial directions of the optical fiber, without requiring the troublesome optical axis adjustment in two dimensions in the rod lens as described above.

According to the invention, therefore, the alignment of optical axes can be remarkably easily performed with higher accuracy with less loss of light in comparison with the prior art. In the embodiment shown in the drawing, moreover, as the synthetic resin is filled in the clearance between the spherical lens 12 and the distal end face 3a of the ferrule, there is no need for a spacer having a suitable refractive index and thickness, for example, required to have a surface accuracy for collimation corresponding to the spherical lens 12.

The base 8 may be made of, for example, a metal, ceramic material, plastic material or the like. The ferrules 3 may be made of a ceramic material, such as alumina, zirconia or the like. The synthetic resin 13 may be made of, for example, an epoxy base adhesive, an acrylate base adhesive or the like. The synthetic resin having an elasticity after solidification may be, for example, silicone resin or the like.

A spherical lens 12 may be fixed to the end of a ferrule 3 as shown in FIG. 2. In more detail, an optical fiber 2 is movable in the ferrule 3 to the right and left as viewed in FIG. 2, and the end of the ferrule 3 is formed with a V-shaped notch or conical notch 14 to which is fixed a spherical lens 12 inscribing to the inner surfaces of the notch 14. The clearance between the notch 14 and the spherical lens 12 is filled with a synthetic resin as described above. The optical fiber 2 is then finely adjusted to the right or left to align the optical axes of the optical fiber and the spherical lens. The optical fiber 2 is positioned and the synthetic resin is then solidified. Under this state, the distal end face 23a of the synthetic resin 23 is positioned opposite polarizer 5 or analyzer 7. With this arrangement, the collimation can be carried out.

The spherical lens 12 with the synthetic resin 23 and the ferrule 3 may be fixed to a base 8. As an alternative, after the spherical lens 12 has been received in the notch 14 of the ferrule 3, the spherical lens 12 is fixed to the ferrule 3 by means of the synthetic resin 23, and the ferrule 3 is then fixed to the base 8 by means of the synthetic resin 23 or another organic adhesive.

The base 8 is preferably joined with the ferrules 3 by means of a synthetic resin adhesive. In this case, the adhesive layer between the base 8 and the ferrules 3 may be separate from the synthetic resin 23, and further may be a different material from the synthetic resin 23. Alternatively, the adhesive layer may be merged with the synthetic resin 23, and in this case they are formed simultaneously by casting of the same material.

While the outer circumferential surface of the spherical lens 12 is inscribed to the end face 23a of the synthetic resin 23 in the embodiment shown in FIG. 2, it will be apparent that the spherical lens 12 may partially project from the end face 23a or may be fully received in the notch 14 inwardly away from the end face 23a.

The optical fibers 2 are shown fixed in the ferrules 3 in the above embodiments. However, the ferrules 3 are not necessarily essential for the optical magnetic-field sensor. The optical fibers 2 may be fixed to the base 8 without using the ferrules. In this case, the techniques usually used in the field of microoptics are applicable. For example, the base 8 is formed in its surface with grooves having a V-shaped cross-section along the extending directions of the optical fibers, and the optical fibers are then arranged in the grooves and fixed to the base 8 by a synthetic resin adhesive.

According to the the optical magnetic-field sensor and the method of producing the same, a synthetic resin is filled in the clearance between the spherical lens and the distal end of the optical fiber to position these members so that the distance between the spherical lens and the optical fiber can be determined so as to be best for collimation. Therefore, the optical magnetic-field sensor according to the invention is superior in collimation characteristics and can reduce loss of quantity of light. Consequently, it is possible to enlarge the distances between locations for detecting fault points and a light transmitter and/or a light receiver.

Moreover, according to the invention the synthetic resin filled between the distal end of the optical fiber and the spherical lens makes easy the alignment of optical axes of the optical fiber and the spherical lens only by adjusting the distance between the distal end of the optical fiber and the spherical lens in one dimension. Therefore, the alignment of optical axes can be much more easily effected with higher accuracy. As a result, the productivity of high accuracy optical magnetic-field sensors is remarkably improved and their production cost is reduced according to the invention.

While the invention has been particularly shown and described with reference to preferred embodiments thereof, it will be understood by those skilled in the art that the foregoing and other changes in form and details can be made therein without departing from the spirit and scope of the invention.

What is claimed is:

1. An optical magnetic field sensor, comprising:
   a base;
   optical parts and an optical element fixed relative to said base;
   optical fibers for transmitting an optical signal to and from said optical parts and said optical element, said optical fibers having distal end portions fixed relative to said base;
   a ferrule for receiving each optical fiber which is movable therein, said ferrule having a notch at one axial end thereof, said notch extending axially into the ferrule toward said distal end portion of its respective optical fiber;
   spherical lenses for collimating said optical signals transmitted to and from said optical parts and said optical element, said spherical lenses being positioned within respective notches of said ferrules such that said spherical lenses are optically aligned with said distal end portions of said optical fibers; and
   a synthetic resin member filled in each notch between said distal ends of the optical fibers and said spherical lenses.

2. The sensor of claim 1, wherein said notch is generally V-shaped in cross-section and outer walls defining said notch converge toward said distal end portion of the optical fiber thereby allowing easy alignment of the optical axes of the spherical lens and the optical fiber.

3. The sensor of claim 1, wherein said synthetic resin member is made of at least one material selected from the group consisting of epoxy base adhesive, acrylate base adhesive and silicon resin.

* * * * *